(12) United States Patent
Oyamada

(10) Patent No.: US 9,893,249 B2
(45) Date of Patent: Feb. 13, 2018

(54) LIGHT-EMITTING DEVICE

(71) Applicants: CITIZEN ELECTRONICS CO., LTD., Yamanashi-ken (JP); CITIZEN WATCH CO., LTD., Tokyo (JP)

(72) Inventor: Nodoka Oyamada, Yamanashi-ken (JP)

(73) Assignees: CITIZEN ELECTRONICS CO., LTD., Yamanashi-Ken (JP); CITIZEN WATCH CO., LTD., Tokyo (JP)

( * ) Notice: Subject to any disclaimer, the term of this patent is extended or adjusted under 35 U.S.C. 154(b) by 0 days.

(21) Appl. No.: 15/381,854

(22) Filed: Dec. 16, 2016

(65) Prior Publication Data

US 2017/0179348 A1 Jun. 22, 2017

(30) Foreign Application Priority Data

Dec. 18, 2015 (JP) .................. 2015-246820

(51) Int. Cl.
*H01L 33/50* (2010.01)
*H01L 33/54* (2010.01)
*H01L 33/48* (2010.01)
*H01L 33/62* (2010.01)

(52) U.S. Cl.
CPC ............ *H01L 33/54* (2013.01); *H01L 33/486* (2013.01); *H01L 33/507* (2013.01); *H01L 33/62* (2013.01); *H01L 2224/48091* (2013.01); *H01L 2224/48137* (2013.01)

(58) Field of Classification Search
CPC ....... H01L 33/48; H01L 33/486; H01L 33/50; H01L 33/507; H01L 33/54; H01L 33/62
USPC ............................................................ 257/88
See application file for complete search history.

(56) References Cited

U.S. PATENT DOCUMENTS

| | | | | |
|---|---|---|---|---|
| 2007/0205425 A1* | 9/2007 | Harada | .................. | H01L 33/58 257/98 |
| 2010/0320483 A1* | 12/2010 | Kadotani | .................. | F21K 9/00 257/88 |
| 2015/0091025 A1* | 4/2015 | Tsuchiya | ............. | H01L 25/0753 257/88 |

FOREIGN PATENT DOCUMENTS

| | | |
|---|---|---|
| JP | 2002-208740 | 7/2002 |
| JP | 2011-009298 | 1/2011 |

* cited by examiner

*Primary Examiner* — Monica D Harrison
(74) *Attorney, Agent, or Firm* — Wenderoth, Lind & Ponack, L.L.P.

(57) ABSTRACT

A light-emitting device includes a base, a substrate, a plurality of light-emitting elements, a filler, and a sealing resin body. The base includes an upper surface and a mounting area. The substrate is disposed on the upper surface of the base. The substrate includes an opening. The mounting area is exposed from the opening of the substrate. The plurality of light-emitting elements are disposed on the mounting area of the base at predetermined intervals with one another. The filler is disposed around each of the plurality of light-emitting elements. The sealing resin body includes a phosphor. The sealing resin body is configured to seal the light-emitting elements and the filler.

20 Claims, 26 Drawing Sheets

[Fig. 1]
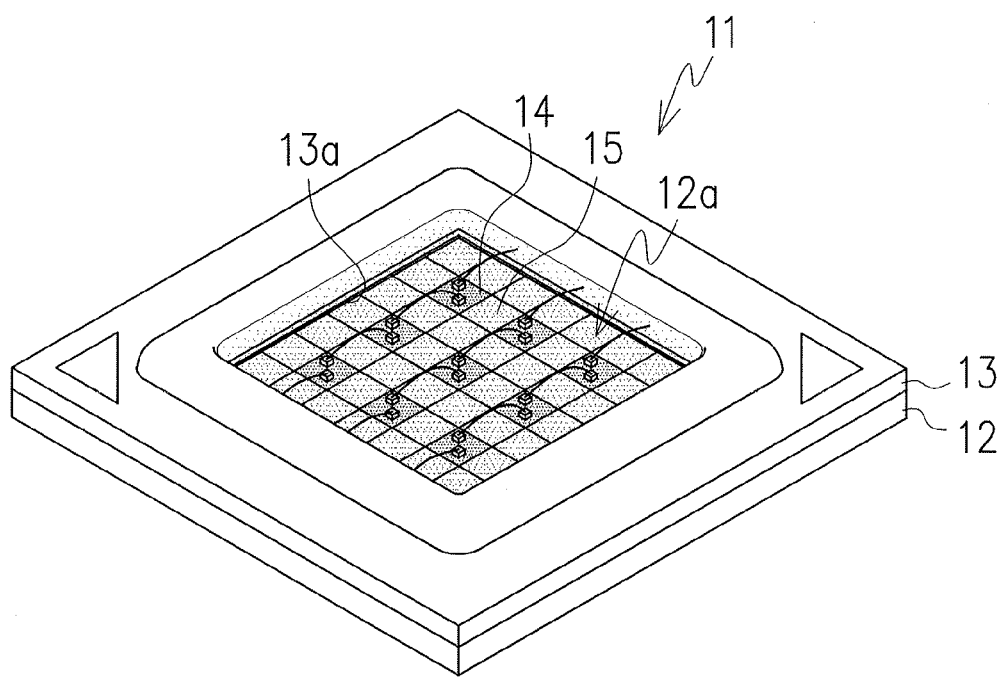

[Fig. 2]
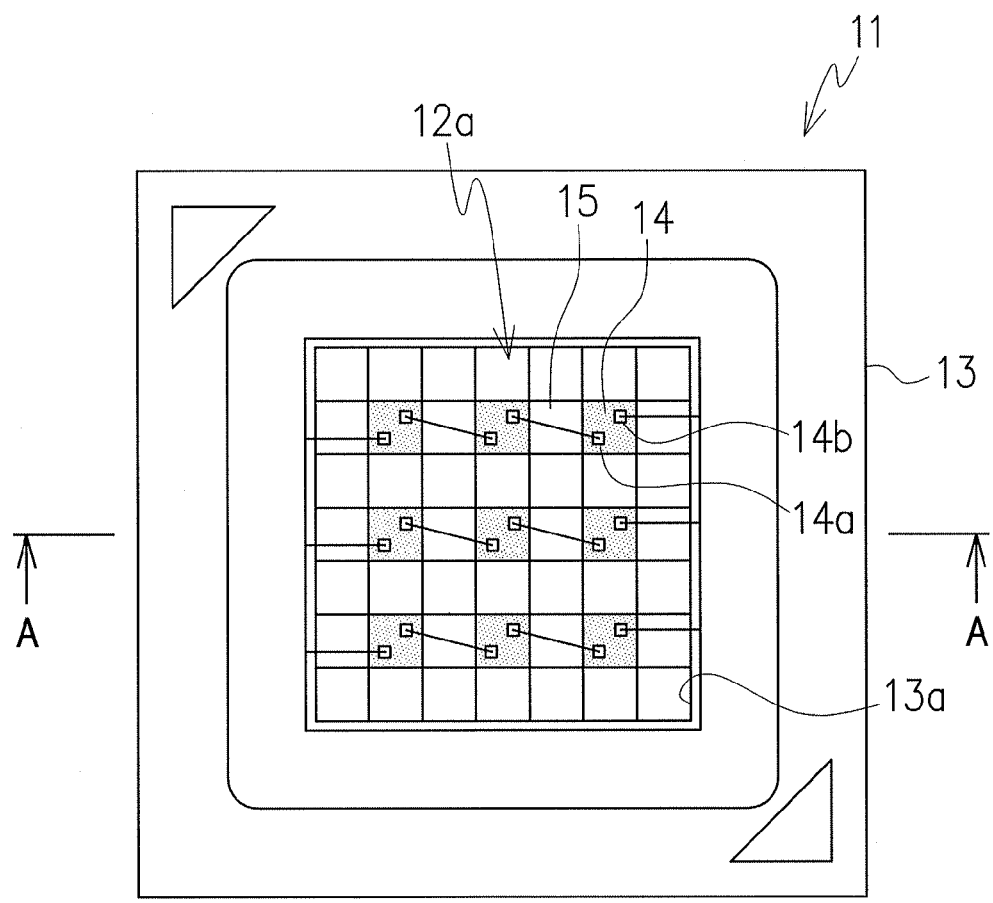

[Fig. 3]
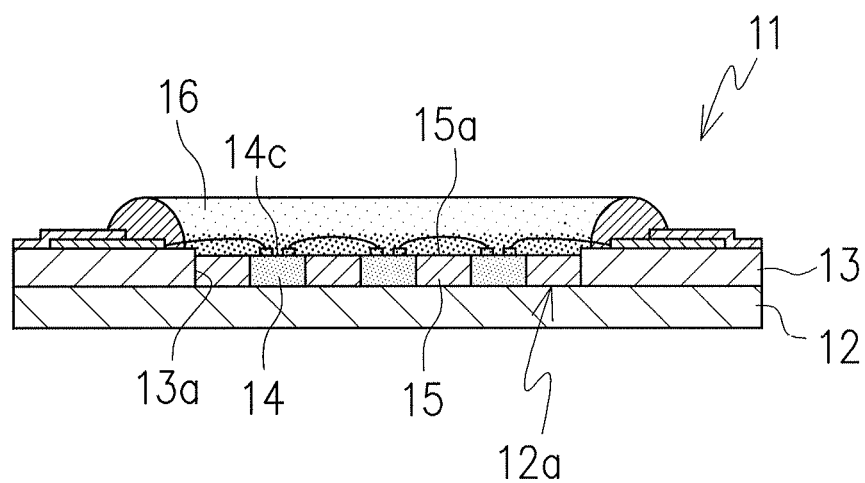

[Fig. 4]
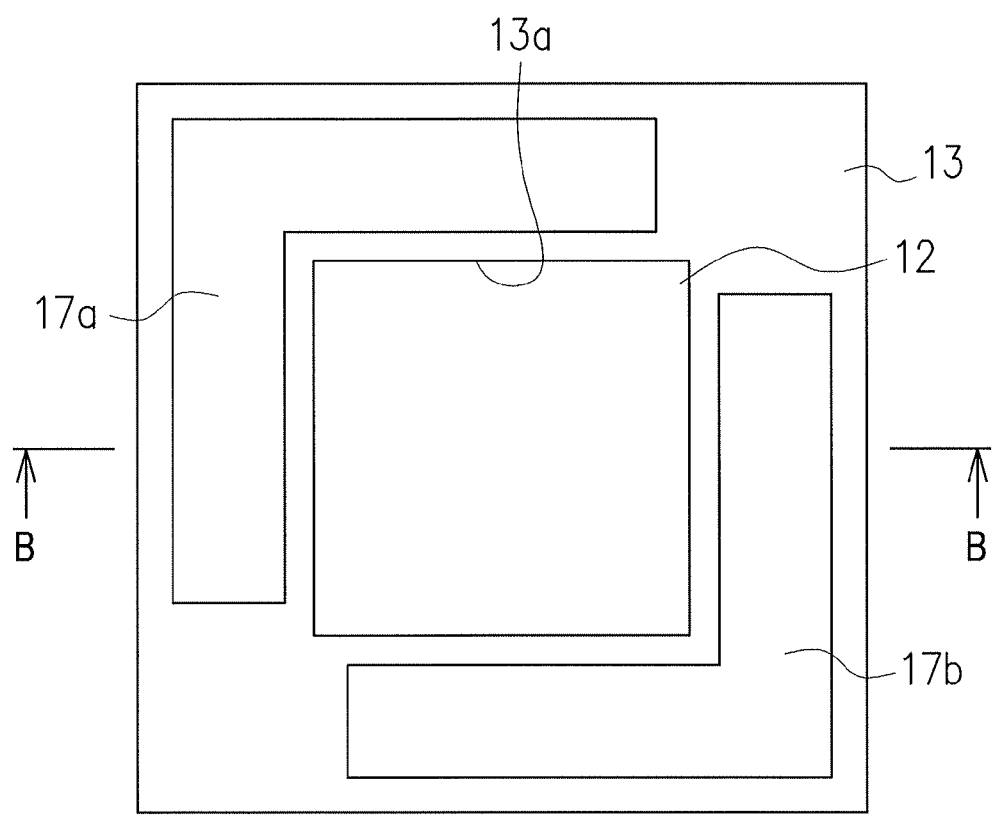

[Fig. 5]
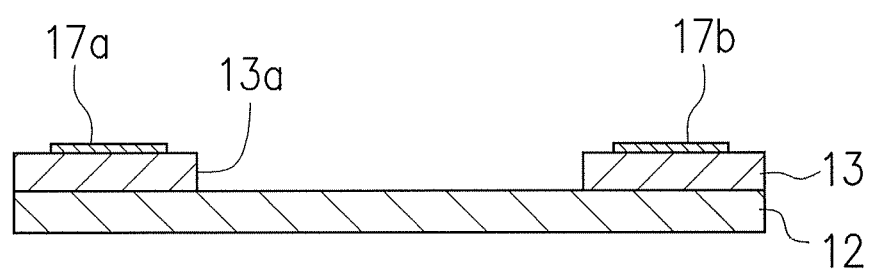

[Fig. 6]
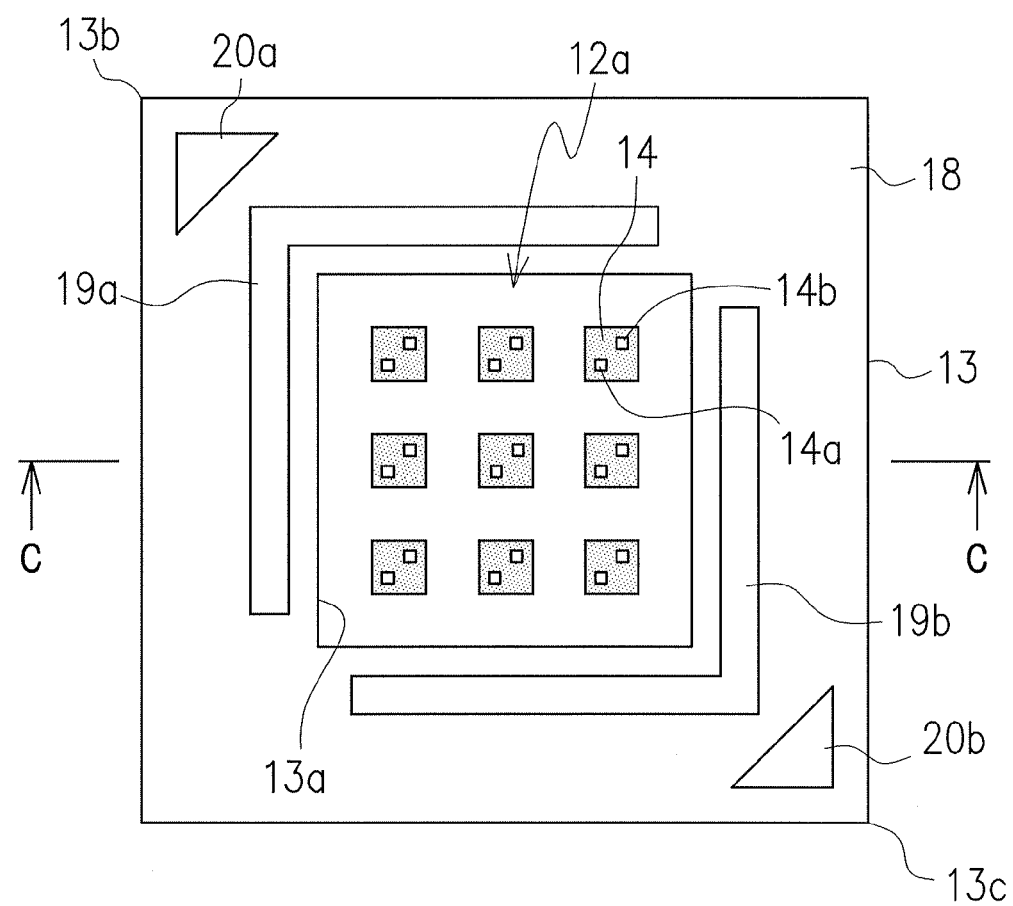

[Fig. 7]
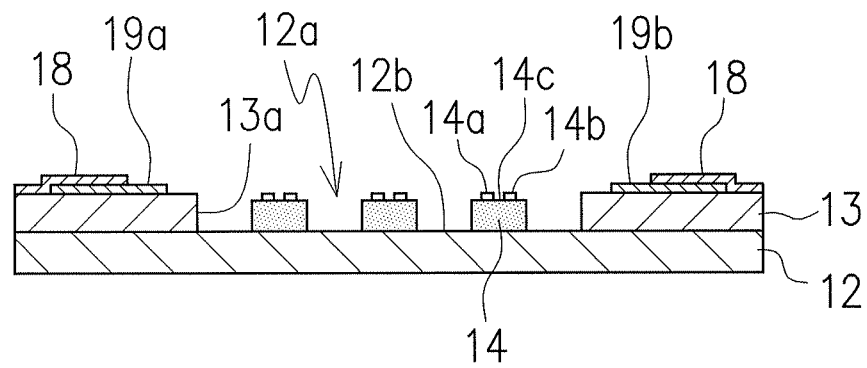

[Fig. 8]
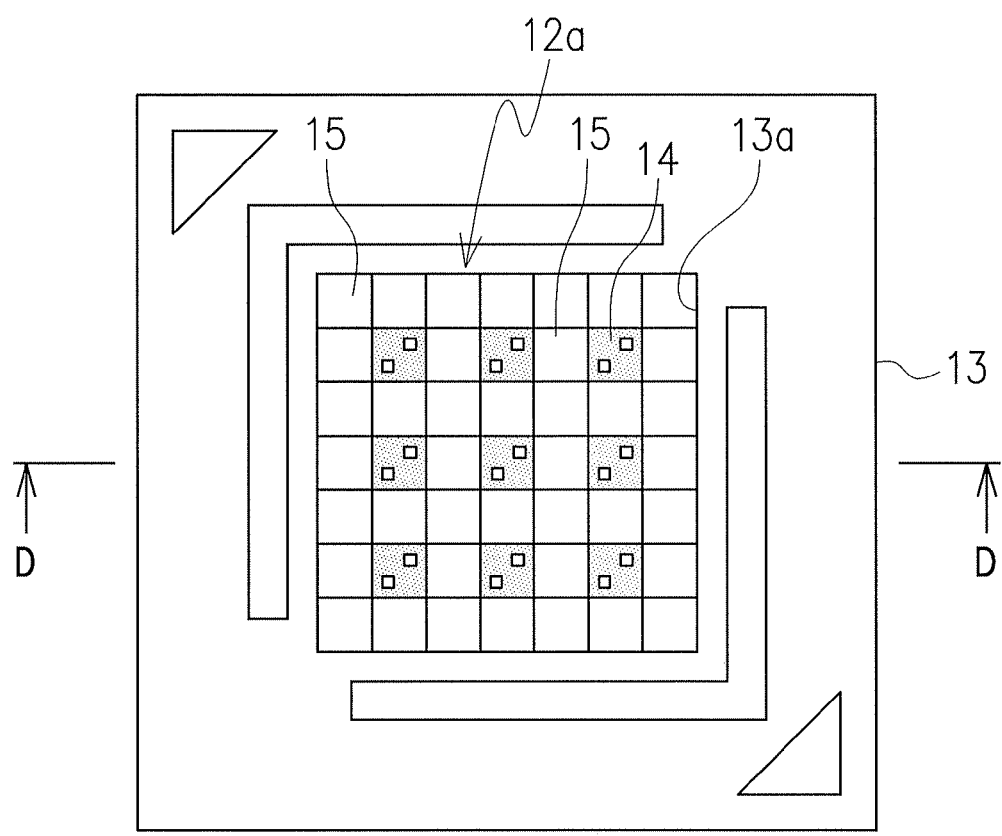

[Fig. 9]
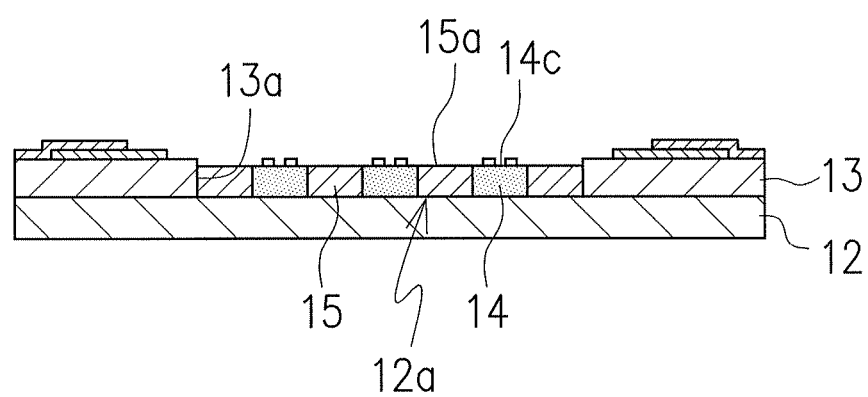

[Fig. 10]
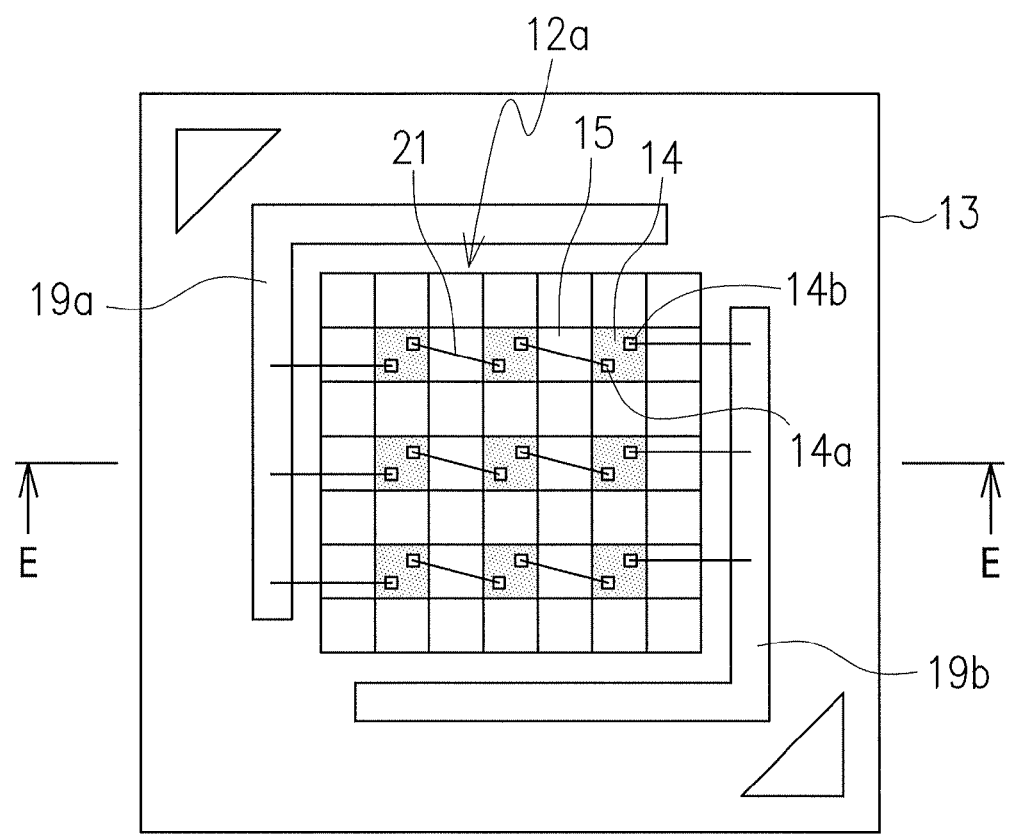

[Fig. 11]
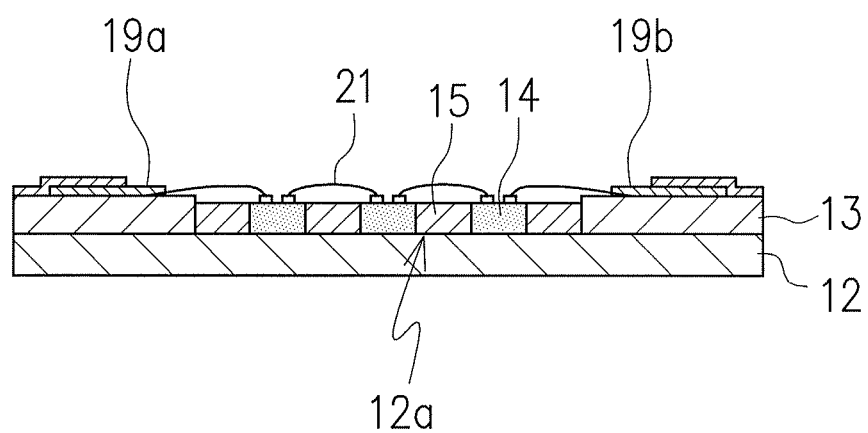

[Fig. 12]
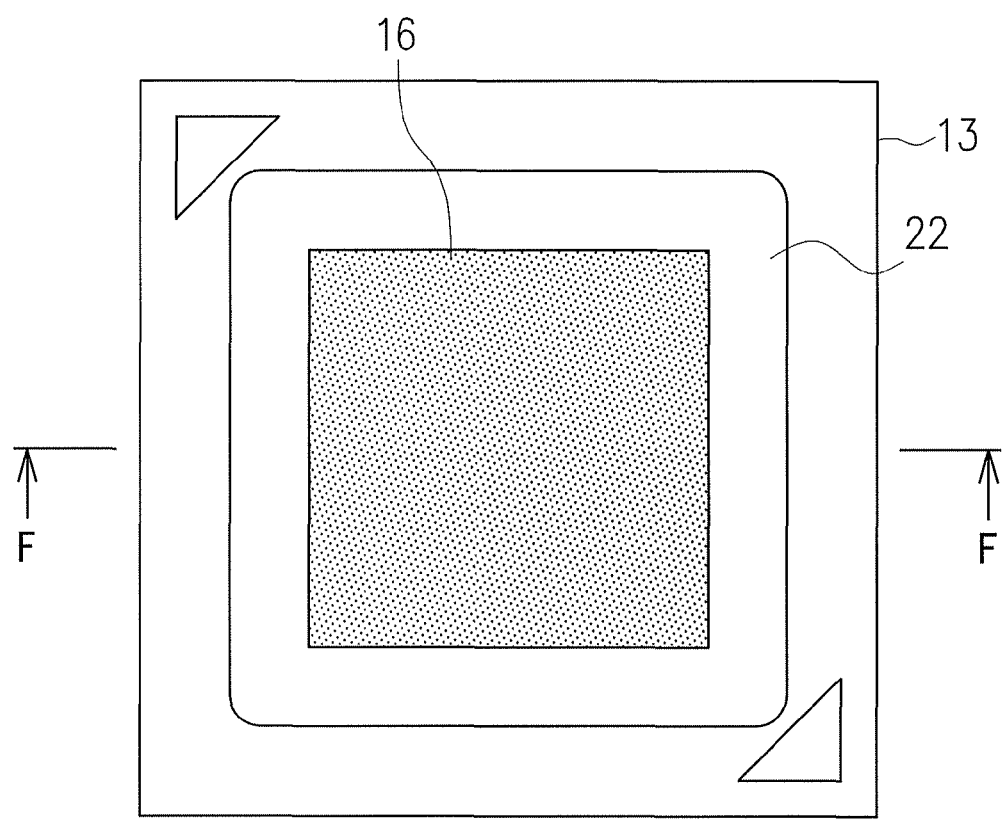

[Fig. 13]
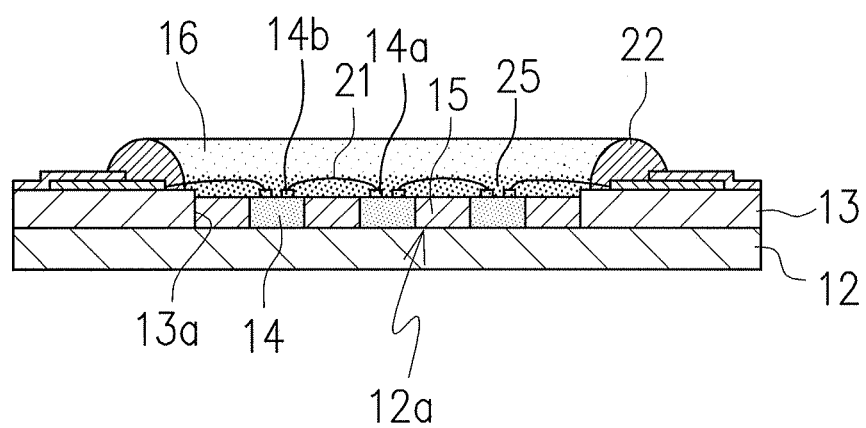

[Fig. 14]
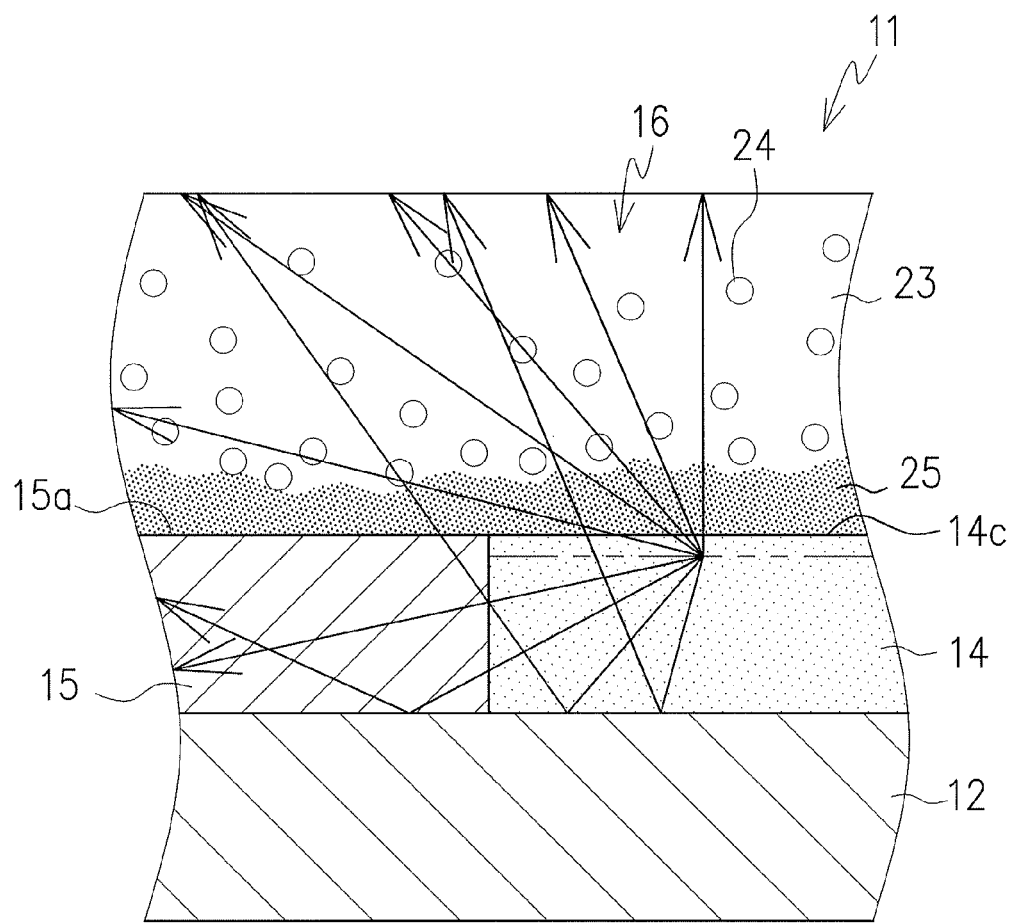

【Fig. 15】
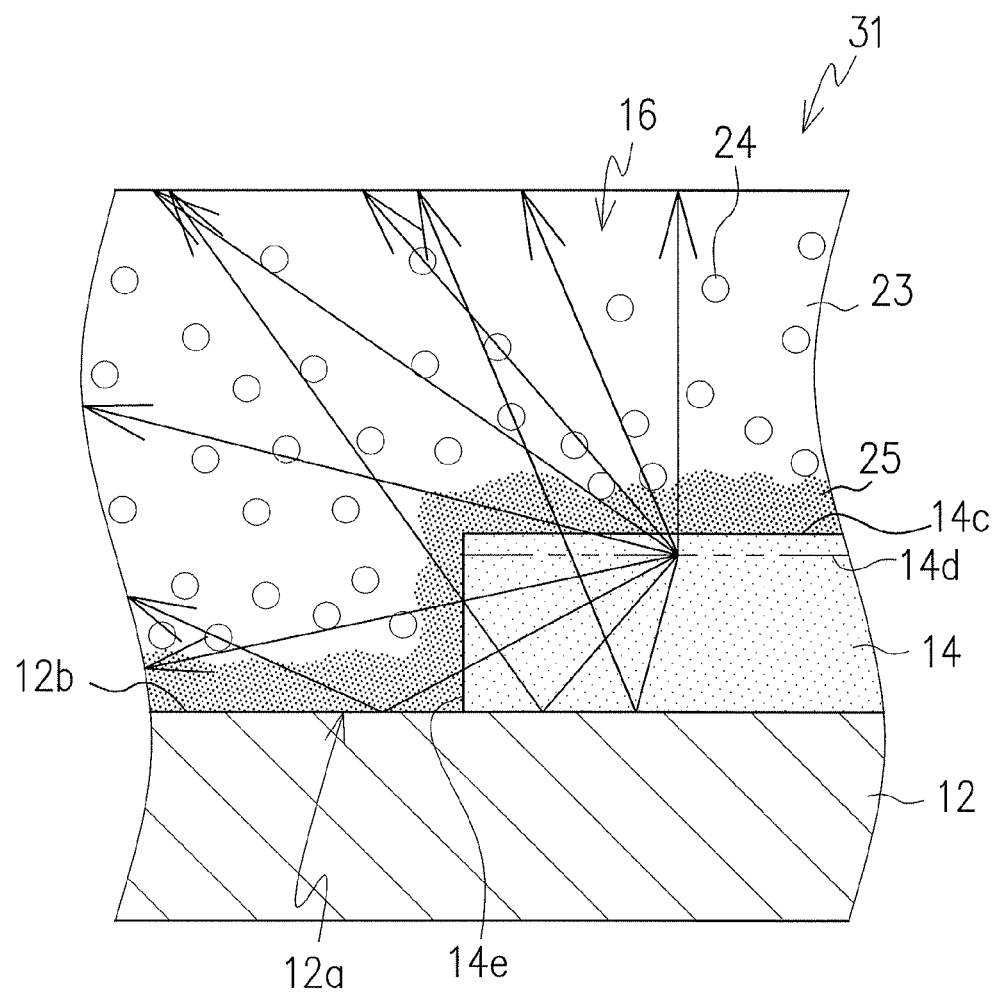

[Fig. 16]
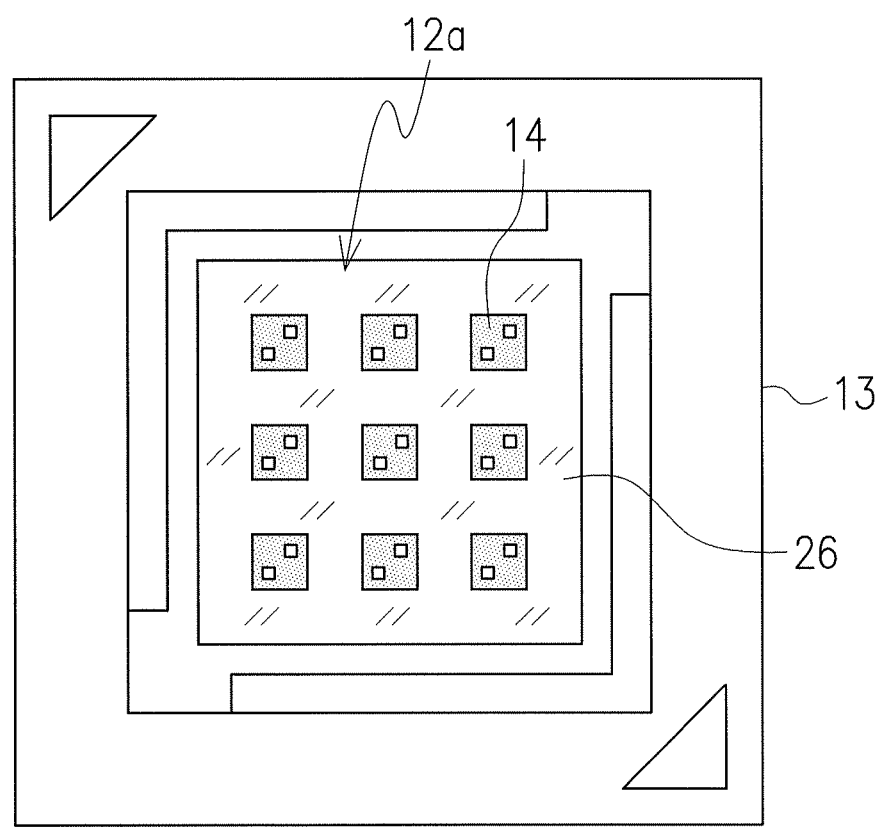

[Fig. 17]
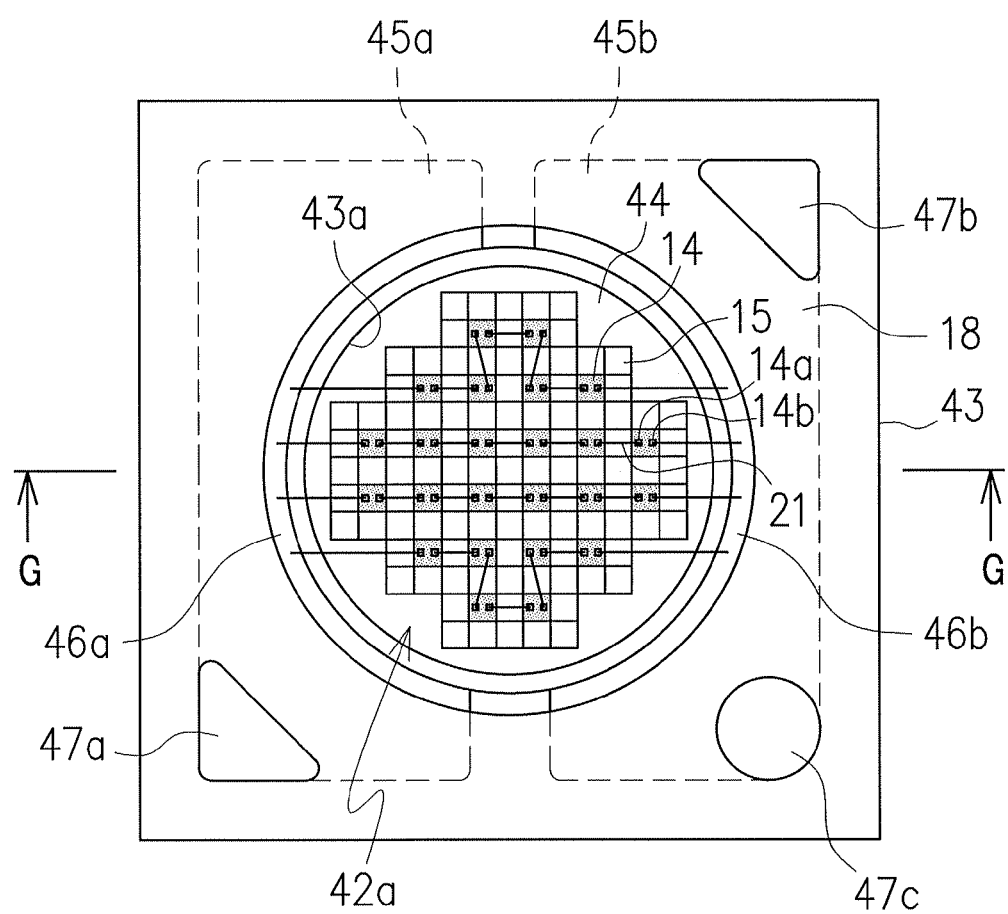

[Fig. 18]
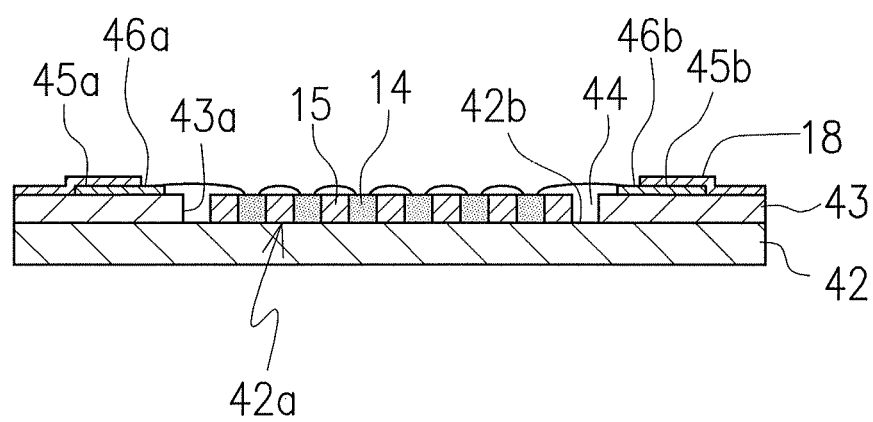

[Fig. 19]
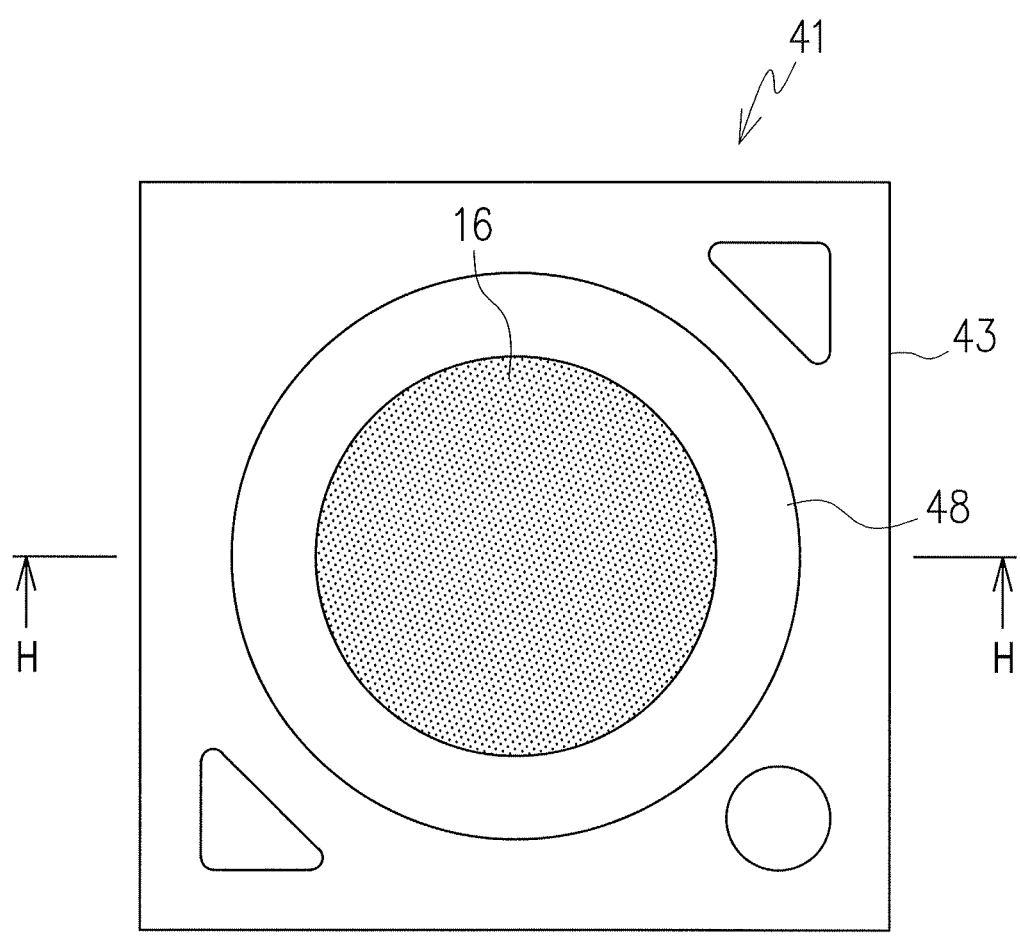

[Fig. 20]
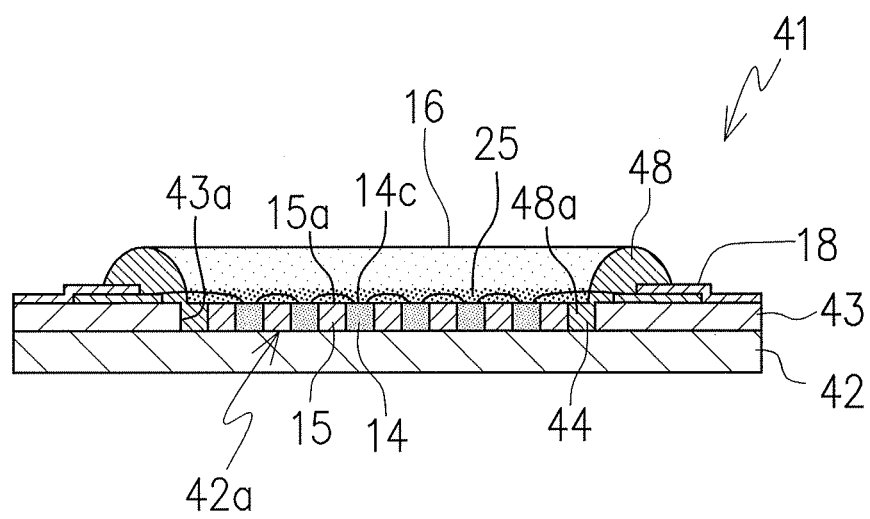

[Fig. 21]
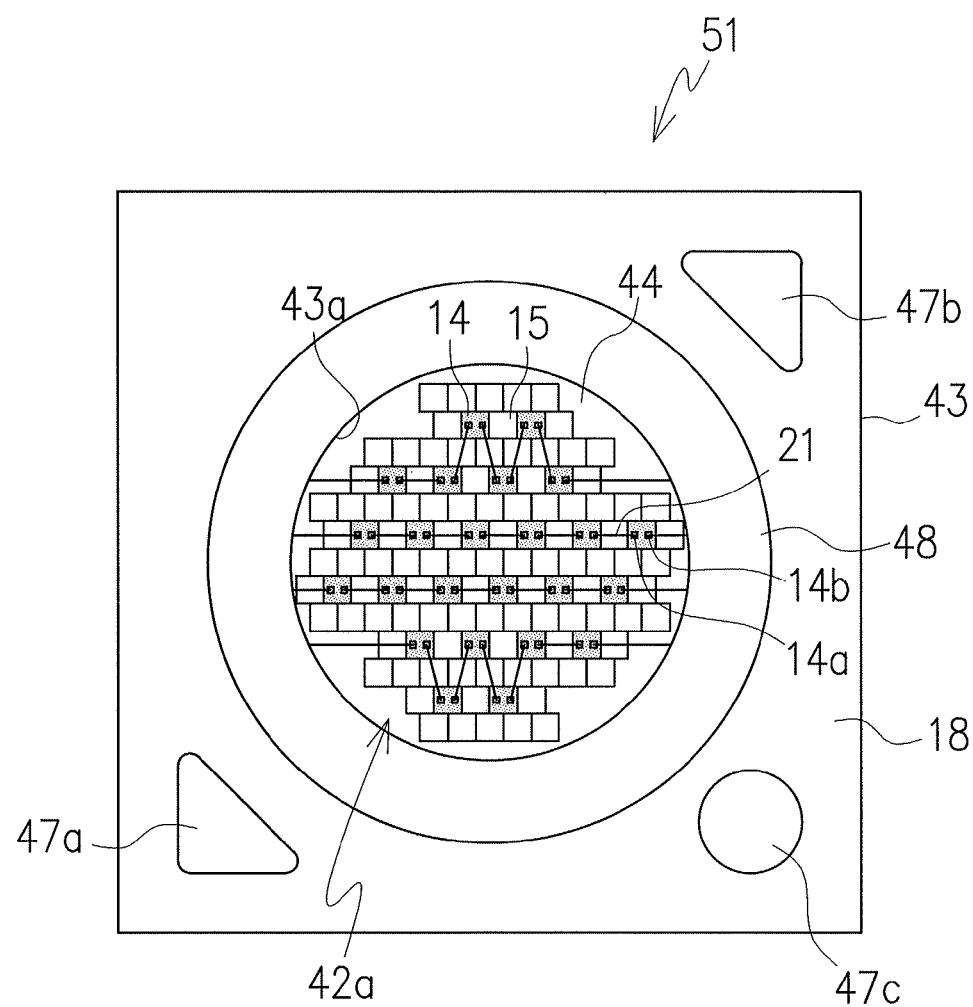

[Fig. 22]
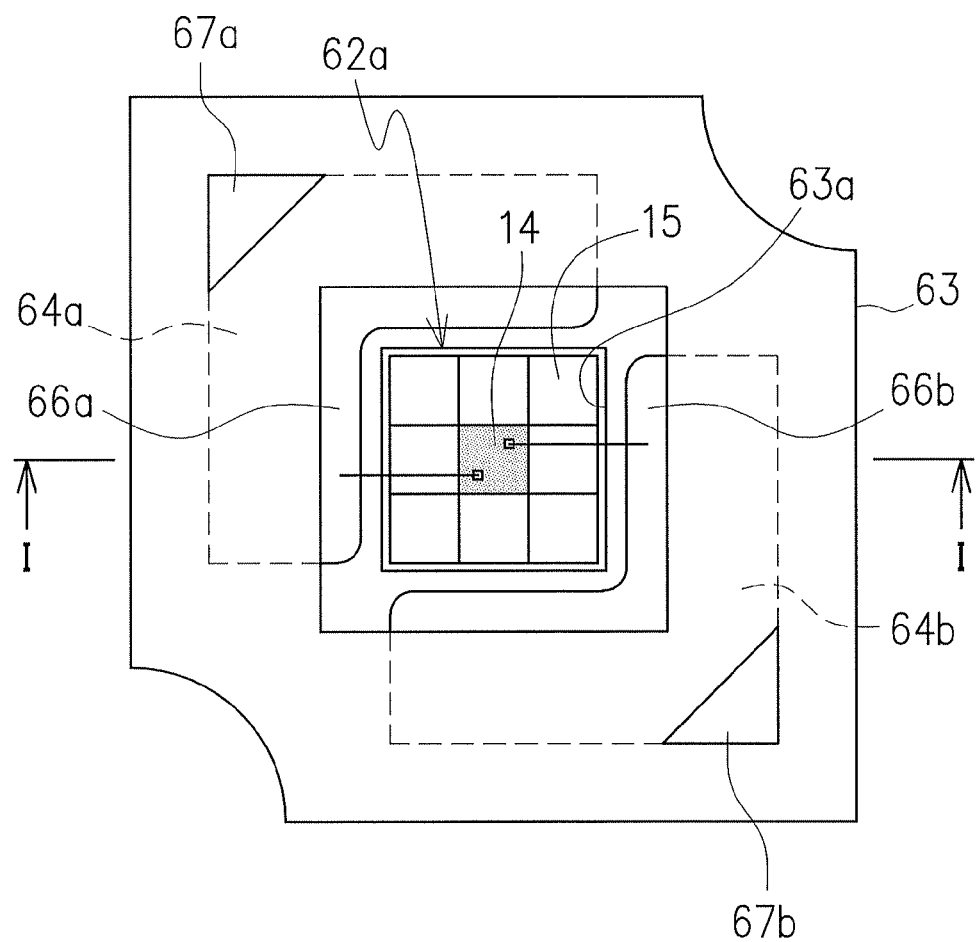

[Fig. 23]
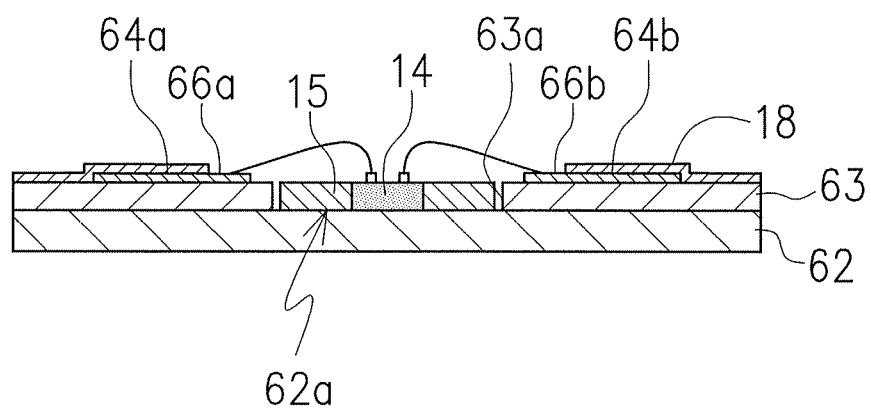

[Fig. 24]
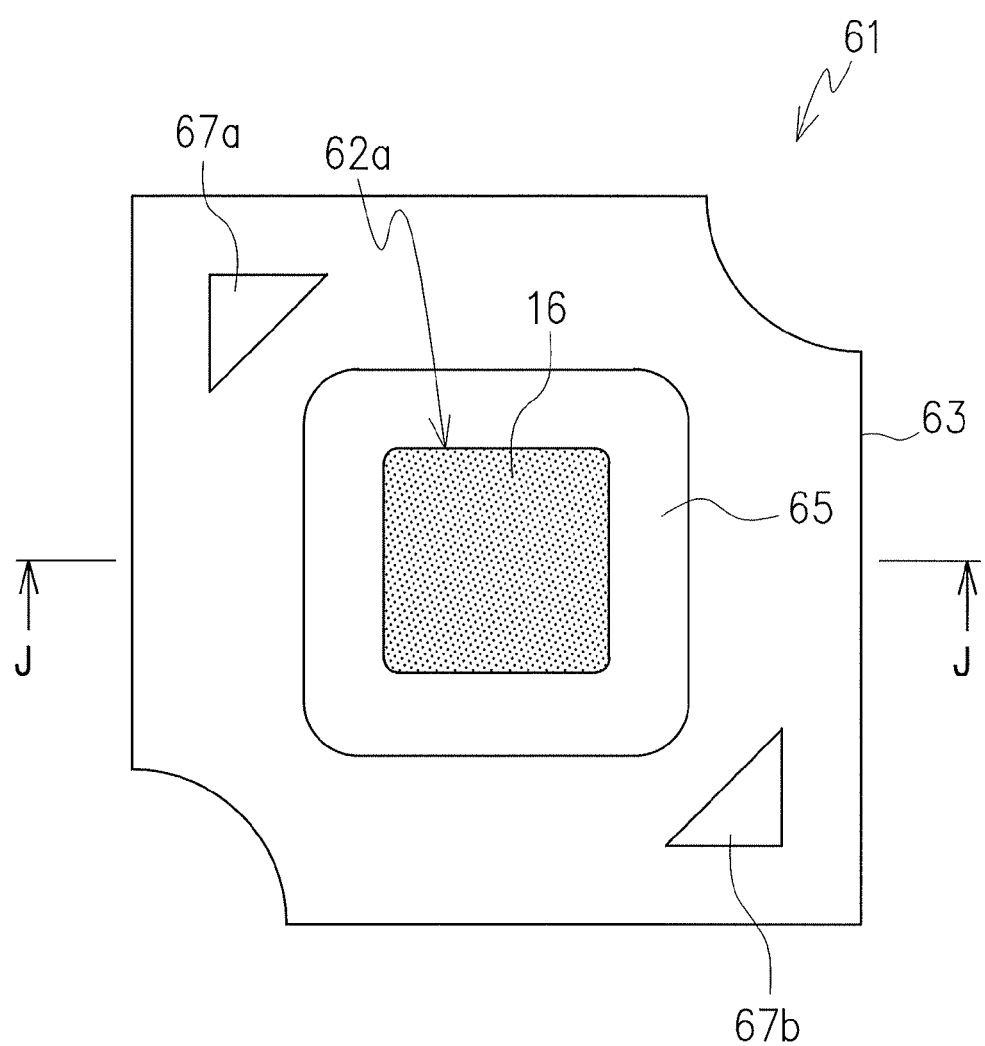

[Fig. 25]
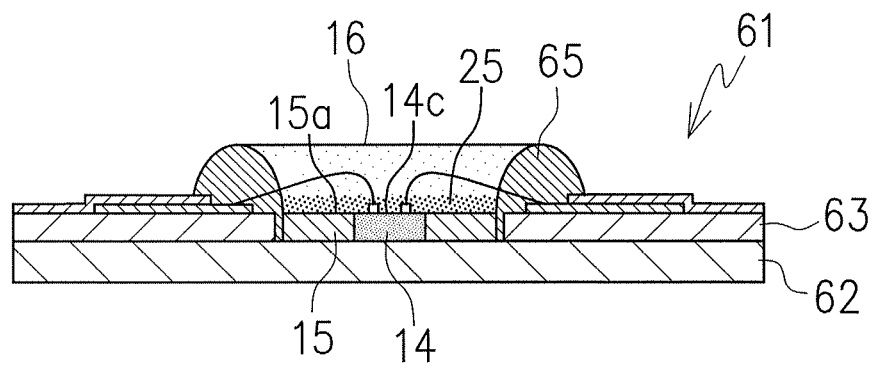

[Fig. 26]
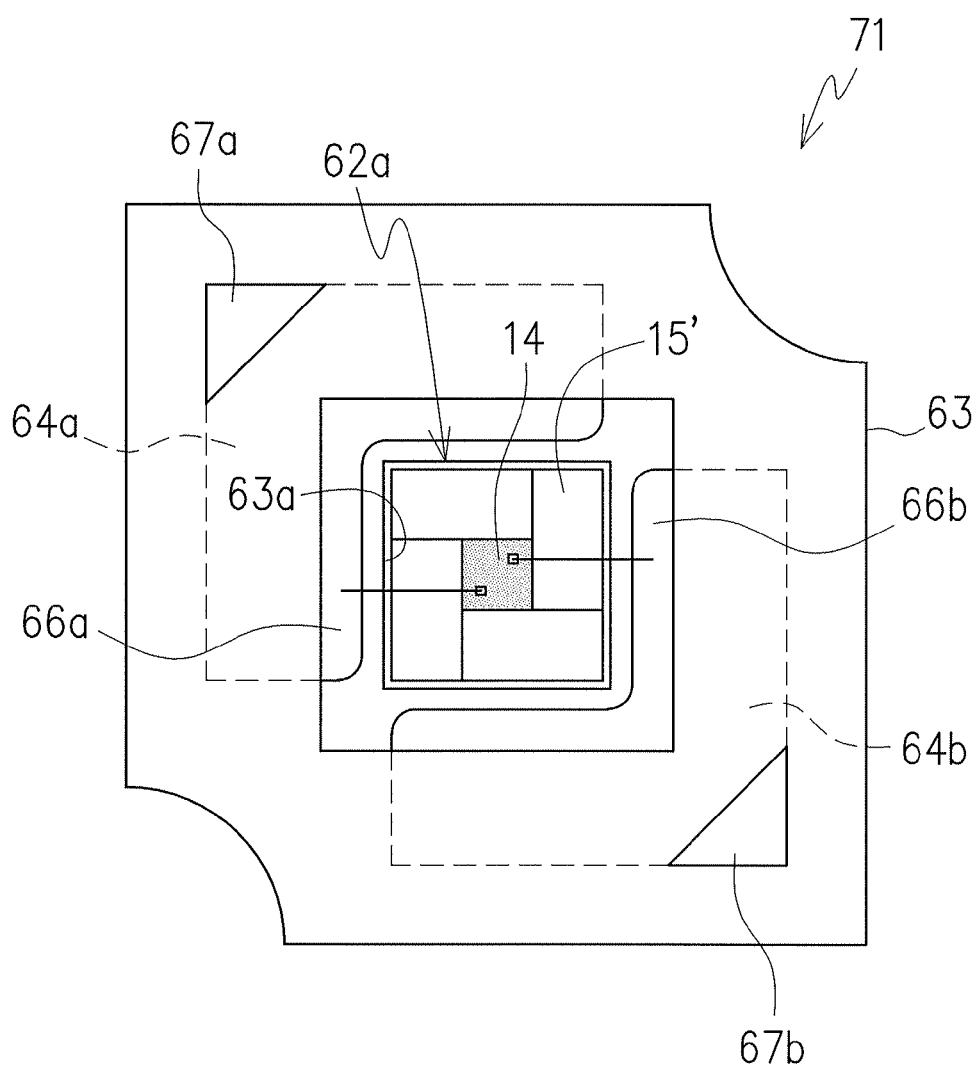

LIGHT-EMITTING DEVICE

CROSS-REFERENCE TO RELATED APPLICATION

The present application claims priority under 35 U.S.C. § 119 to Japanese Patent Application No. 2015-246820, filed Dec. 18, 2015. The contents of this application are incorporated herein by reference in their entirety.

BACKGROUND OF THE INVENTION

Field of the Invention

The present invention relates to a light-emitting device.

Discussion of the Background

Lighting devices using a plurality of light-emitting diode (LED) elements are known as replacements for light bulbs, fluorescent lamps, and other optical sources for illuminating purposes. LED elements consume lower power than light bulbs, fluorescent lamps, and other optical sources do. However, since LED elements are point sources, they provide narrower ranges of directivity. This necessitates some tens to hundreds of LED elements to be used in the lighting devices, and these LEDs need sealing by light-transmitting resin to form a light-emitting surface of approximately uniform brightness.

Japanese Unexamined Patent Application Publication No. 2011-009298 discloses a light-emitting-diode optical source device that includes a thermally conductive base, an insulation plate, and a plurality of LED elements. The insulation plate is fixed to a surface of the base and has a conduction pattern and a through hole that are formed on a surface of the insulation plate. The plurality of LED elements are mounted in a mounting area that is on the surface of the base and that is exposed by the through hole.

Japanese Unexamined Patent Application Publication No. 2002-208740 discloses a light-emitting diode that includes an LED element and a particulate phosphor. The LED element is disposed on a support. The phosphor is disposed over the LED element and the support. The phosphor absorbs at least part of light emitted from the LED element, changes the wavelength of the absorbed light, and emits the light. The light-emitting diode has a first coating portion and a second coating portion. The first coating portion includes a part of the phosphor that is disposed on the LED element. The second coating portion includes a part of the phosphor that is disposed on the support and that is not disposed on the LED element. The first coating portion and the second coating portion have approximately the same thicknesses.

SUMMARY OF THE INVENTION

According to one aspect of the present invention, a light-emitting device includes a base, a substrate, at least one light-emitting element, a filler, and a sealing resin body. The base includes an upper surface and a mounting area. The substrate is disposed on the upper surface of the base. The substrate includes an opening. The mounting area is exposed from the opening of the substrate. The at least one light-emitting element is disposed on the mounting area of the base. The filler is disposed around the light-emitting element. The sealing resin body includes a phosphor. The sealing resin body is configured to seal the light-emitting element and the filler.

According to another aspect of the present invention, a light-emitting device includes a base, a substrate, a plurality of light-emitting elements, a filler, and a sealing resin body. The base includes an upper surface and a mounting area. The substrate is disposed on the upper surface of the base. The substrate includes an opening. The mounting area is exposed from the opening of the substrate. The plurality of light-emitting elements are disposed on the mounting area of the base at predetermined intervals with one another. The filler is disposed around each of the plurality of light-emitting elements. The sealing resin body includes a phosphor. The sealing resin body is configured to seal the light-emitting elements and the filler.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 1 is a perspective view of a light-emitting device according to a first embodiment of the present invention;

FIG. 2 is a plan view of the light-emitting device according to the first embodiment of the present invention;

FIG. 3 is a cross-sectional view taken along the line A-A of FIG. 2;

FIG. 4 is a plan view of the light-emitting device according to the first embodiment of the present invention showing a base and a substrate;

FIG. 5 is a cross-sectional view taken along the line B-B of FIG. 4;

FIG. 6 is a plan view of a plurality of light-emitting elements arranged on a mounting area;

FIG. 7 is a cross-sectional view taken along the line C-C of FIG. 6;

FIG. 8 is a plan view of dummy elements arranged around the light-emitting elements;

FIG. 9 is a cross-sectional view taken along the line D-D of FIG. 8;

FIG. 10 is a plan view of the plurality of light-emitting elements, which are arranged in the mounting area, showing wiring on the light-emitting elements;

FIG. 11 is a cross-sectional view taken along the line E-E of FIG. 10;

FIG. 12 is a plan view of a sealing resin body sealing the plurality of light-emitting elements and the dummy elements, which are arranged in the mounting area;

FIG. 13 is a cross-sectional view taken along the line F-F of FIG. 12;

FIG. 14 is a cross-sectional view of the light-emitting device according to the embodiment of the present invention showing light-emitting operation;

FIG. 15 is a cross-sectional view of a conventional light-emitting device showing light-emitting operation;

FIG. 16 is a plan view of a light-emitting device according to a second embodiment of the present invention;

FIG. 17 is a plan view of a light-emitting device according to a third embodiment of the present invention showing a plurality of light-emitting elements arranged in a mounting area of a base and dummy elements arranged around the light-emitting elements;

FIG. 18 is a cross-sectional view taken along the line G-G of FIG. 17;

FIG. 19 is a plan view of the light-emitting device according to the third embodiment of the present invention;

FIG. 20 is a cross-sectional view taken along the line H-H of FIG. 19;

FIG. 21 is a plan view of a light-emitting device according to a fourth embodiment of the present invention showing a plurality of light-emitting elements arranged on a mounting area of a base and dummy elements having the same shape and arranged around the light-emitting elements;

FIG. 22 is a plan view of a light-emitting device according to a fifth embodiment of the present invention, and the light-emitting device includes a single light-emitting element arranged on a mounting area of a base;

FIG. 23 is a cross-sectional view taken along the line I-I of FIG. 22;

FIG. 24 is a plan view of the light-emitting device according to the fifth embodiment of the present invention;

FIG. 25 is a cross-sectional view taken along the line J-J of FIG. 24; and

FIG. 26 is a plan view of a light-emitting device according to a sixth embodiment of the present invention, and the light-emitting device includes a single light-emitting element arranged in a mounting area of a base and dummy elements that have a size twice the size of the light-emitting element and that are arranged around the light-emitting element.

DESCRIPTION OF THE EMBODIMENTS

The following detailed description refers to the accompanying drawings, which illustrate specific embodiments of the invention. Other embodiments including different structures and operation do not depart from the scope of the present invention.

Embodiments of the invention are described with reference to drawings included herewith. Like reference numbers refer to like structures throughout. It should be noted that the drawings are schematic in nature. Not all parts are always shown to scale.

FIGS. 1 to 3 show a light-emitting device 11 according to a first embodiment of the present invention. The light-emitting device 11 of this embodiment includes a base 12, a substrate 13, a plurality of light-emitting elements 14, dummy elements 15, and a sealing resin body 16. The substrate 13 is placed on the upper surface of the base 12 and has an opening 13a. The base 12 has a mounting area 12a. The mounting area 12a is exposed from the opening 13a. The plurality of light-emitting elements 14 are arranged in the mounting area 12a at predetermined intervals with one another. The dummy elements 15 are fillers for filling gaps between the light-emitting elements 14. The sealing resin body 16 contains a phosphor and seals the plurality of light-emitting elements 14 and the dummy elements 15. In this embodiment, each of the light-emitting elements 14 is surrounded by four dummy elements 15 arranged around the light-emitting element 14. The plurality of light-emitting elements 14 are all LED elements.

The base 12 is made of metal having high thermal conductivity such as aluminum and copper to improve heat dissipation from the light-emitting elements 14. The base 12 is a rectangular plate having a predetermined thickness.

The substrate 13 is a rectangular plate that is approximately the same shape as the base 12 and has the opening 13a at the central portion of the substrate 13. The opening 13a is large and rectangular. In this embodiment, the substrate 13 is a copper laminate and has a pair of L-shaped electrodes 17a, 17b. As illustrated in FIGS. 4 and 5, the electrodes 17a, 17b are formed along the rim of the opening 13a. As illustrated in FIGS. 6 and 7, the L-shaped electrodes 17a, 17b include a pair of L-shaped electrode patterns 19a, 19b and a pair of triangular electrode pads 20a, 20b. The L-shaped electrode patterns 19a, 19b extend along the circumference of the opening 13a. The triangular electrode pads 20a, 20b are formed near opposite corners 13b, 13c of the substrate 13. The L-shaped electrode patterns 19a, 19b and the triangular electrode pads 20a, 20b are formed by applying a resist film 18 on the upper surface of the substrate 13. The substrate may be an insulative substrate such as a resin substrate and a ceramic substrate.

As illustrated in FIGS. 1 and 2, this embodiment includes nine light-emitting elements 14. The nine light-emitting elements 14 are arranged in three rows and three columns to correspond to an outer shape of the rectangular mounting area 12a. The number of the light-emitting elements 14, however, does not necessarily have to be nine. The number of the light-emitting elements 14 may range from tens to hundreds to be used as a light-emitting device for illuminating purposes. The light-emitting elements 14 are secured to the upper surface of the base 12 with, for example, an adhesive. Each of the light-emitting elements 14 includes a pair of element electrodes 14a, 14b on the upper surface of the light-emitting element 14.

The dummy elements 15 have the same shape as the plurality of light-emitting elements 14. As illustrated in FIGS. 1 and 2, the dummy elements 15 are arranged between the plurality of light-emitting elements 14, which are arranged on the mounting area 12a of the base 12 at predetermined intervals with one another, so that the light-emitting elements 14 and the dummy elements 15 are arranged in a checkered pattern. Four sides of each of the light-emitting elements 14 are surrounded by four dummy elements 15. The dummy elements 15 desirably fill gaps between the light-emitting elements 14 in a state in which the dummy elements 15 contact the side surfaces of the light-emitting elements 14. In this embodiment, the dummy elements 15 are also arranged along the entire circumference along the inner circumferential edge of the opening 13a, which is formed in the substrate 13. Thus, the entire mounting area 12a is filled with the dummy elements 15 except the sections where the plurality of light-emitting elements 14 are provided.

The dummy elements 15 have the planar shape and the height that are approximately the same as the planar shape and the height of the plurality of light-emitting elements 14. Thus, as illustrated in FIG. 3, the vertical positions of upper surfaces 14c of the plurality of light-emitting elements 14, which are arranged on the mounting area 12a, are approximately the same as the vertical positions of upper surfaces 15a of the dummy elements 15, which are also arranged on the mounting area 12a. That is, the upper surfaces 14c of the plurality of light-emitting elements 14 are approximately flush with the upper surfaces 15a of the dummy elements 15. The dummy elements 15 are desirably formed of sapphire or silicone that transmits light and has a higher thermal conductivity than the light-emitting elements 14 and the sealing resin body 16. Superior heat dissipation of the dummy elements 15 inhibits deterioration of the light-emitting elements 14 and prevents decrease in the luminance that might otherwise be caused by deterioration of the light-emitting elements 14.

A method for producing the light-emitting device 11 configured as described above will now be described with reference to FIGS. 4 to 13. FIGS. 4 and 5 show the rectangular metal base 12 and the insulative substrate 13, which is placed on the upper surface of the base 12. The substrate 13, which has the same shape as the base 12, has the large rectangular opening 13a at the central portion, and the pair of L-shaped electrodes 17a, 17b are provided along the rim of the opening 13a.

As illustrated in FIGS. 6 and 7, the L-shaped electrodes 17a, 17b include the pair of L-shaped electrode patterns 19a, 19b, which extend along the circumference of the opening 13a, and the pair of triangular electrode pads 20a, 20b near the opposite corners 13b, 13c of the substrate 13. The L-shaped electrode patterns 19a, 19b and the triangular electrode pads 20a, 20b are formed by applying the resist film 18 on the upper surface of the substrate 13. The nine light-emitting elements 14 are arranged on the mounting area 12a of the base 12 in three rows and three columns at predetermined intervals. The intervals are spaces having a size that corresponds to the size of each light-emitting element 14.

Spaces having the same size as each of the light-emitting elements 14 are provided along the entire circumference between the outer circumferential portion of the plurality of light-emitting elements 14 that have been arranged on the mounting area 12a and the inner circumferential edge of the opening 13a. The plurality of light-emitting elements 14 are fixed to the upper surface 12b of the base 12 with, for example, an adhesive. The pair of element electrodes 14a, 14b are provided on the upper surface 14c of each light-emitting element 14.

As illustrated in FIGS. 8 and 9, the fillers, which are the dummy elements 15 in this embodiment, are arranged between the light-emitting elements 14, which are arranged on the mounting area 12a of the base 12 at predetermined intervals with one another. When all gaps are filled with the dummy elements 15, each of the light-emitting elements 14 is surrounded by the dummy elements 15 all around. The plurality of light-emitting elements 14 and the plurality of dummy elements 15 are arranged alternately or in a regularly staggered manner to make the light-emitting condition of the light-emitting elements 14 uniform. Similar dummy elements 15 are also arranged in the spaces formed between the outer circumferential portion of the plurality of light-emitting elements 14, which are arranged on the mounting area 12a, and the inner circumferential edge of the opening 13a. In this manner, the mounting area 12a of the base 12 is entirely filled with the plurality of light-emitting elements 14 and the plurality of dummy elements 15. Since the height of the dummy elements 15 matches with the height of the light-emitting elements 14, the upper surfaces 14c of the light-emitting elements 14 are approximately flush with the upper surfaces 15a of the dummy elements 15 in the mounting area 12a as illustrated in FIG. 9.

After the plurality of light-emitting elements 14 and the plurality of dummy elements 15 are arranged on the mounting area 12a, the laterally adjacent light-emitting elements 14 are electrically coupled to each other with the associated one of the dummy elements 15 located in between as illustrated in FIGS. 10 and 11. In this embodiment, the element electrodes 14a, 14b on each of the three laterally arranged light-emitting elements 14 are electrically coupled to one another using bonding wires 21. This embodiment is configured to have three rows of linear light-emitting portions arranged in parallel by electrically coupling the light-emitting elements 14 on the left and right ends of each row to the pair of L-shaped electrode patterns 19a, 19b also. Each linear light-emitting portion includes three light-emitting elements 14 coupled in series.

After the plurality of light-emitting elements 14 are electrically coupled to one another, as illustrated in FIGS. 12 and 13, the plurality of light-emitting elements 14 and the plurality of dummy elements 15, which are arranged on the mounting area 12a, are sealed with the sealing resin body 16. First, a light-transmitting sealing frame 22 is provided around the opening 13a, which is formed in the substrate 13. The sealing frame 22 is formed to have a height that is sufficient to hide the bonding wires 21, which couple the element electrodes 14a, 14b of the light-emitting elements 14. The sealing resin body 16 is then applied to the mounting area 12a, which is surrounded by the sealing frame 22.

The sealing resin body 16 is a light-transmitting resin binder 23 with a predetermined amount of particulate phosphor 24 as illustrated in FIG. 14. The resin binder 23 includes an epoxy resin or a silicone resin, and the phosphor 24 includes yttrium aluminum garnet (YAG) or particulate dye that is a raw material of pigment particles.

Since the phosphor 24 has a greater specific gravity than the resin binder 23, the phosphor 24 is deposited while the resin binder 23 cures and settles near the upper surfaces 14c of the plurality of light-emitting elements 14 and the upper surfaces 15a of the dummy elements 15. Since the upper surfaces 14c of the plurality of light-emitting elements 14 are approximately flush with the upper surfaces 15a of the dummy elements 15, the phosphor 24 is deposited near the upper surfaces 14c of the plurality of light-emitting elements 14 and the upper surfaces 15a of the dummy elements 15 uniformly. As a result, a phosphor deposition layer 25 is uniformly formed near the upper surfaces 14c of the plurality of light-emitting elements 14 and near the upper surfaces 15a of the dummy elements 15. The phosphor deposition layer 25 has a great settling ratio of the phosphor 24. Thus, no border between colors is formed in the sealing resin body 16 between a section of the sealing resin body 16 corresponding to the light-emitting elements 14 and a section of the sealing resin body 16 corresponding to the dummy elements 15 when the sealing resin body 16 is viewed from the top, and the entire sealing resin body 16 has a uniform luminescent color. Since the phosphor 24 is uniformly dispersed over the light-emitting elements 14 and the dummy elements 15 when the sealing resin body 16 is applied, no uneven light emission is caused, and uniform light emission is obtained as a whole.

FIG. 15 shows light-emitting operation performed by a conventional light-emitting device 31. The conventional light-emitting device 31 does not use dummy elements like those used in the above-described embodiment. In the light-emitting device 31, since the spaces between the plurality of light-emitting elements 14, which are arranged on the mounting area 12a of the base 12, are filled with the sealing resin body 16, the phosphor 24 is deposited near the upper surfaces 14c of the light-emitting elements 14 and near the upper surface 12b of the base 12 as illustrated in FIG. 15. That is, since the height of the deposited phosphor 24 varies, a border between colors is generated in the sealing resin body 16 between a section of the sealing resin body 16 corresponding to the light-emitting elements 14 and a section of the sealing resin body 16 corresponding to the area surrounding the light-emitting elements 14 when the sealing resin body 16 is viewed from the top.

In particular, since light emitted upward from a PN junction 14d directly excites the phosphor 24 near the upper surface 14c of each light-emitting element 14, there is no difference from the case of FIG. 14. In contrast, among the light that is emitted downward from the PN junction 14d, the light that passes through a side surface 14e of each light-emitting element 14 excites the phosphor 24 in the phosphor deposition layer 25 near the side surface 14e of the light-emitting element 14. Furthermore, among the light that is emitted downward from the PN junction 14d of each light-emitting element 14, the light that has passed through the side surface 14e of each light-emitting element 14 and entered the phosphor deposition layer 25 and the light that has passed through the side surface 14e of each light-emitting element 14 and reflected by the upper surface 12b of the base 12 excite the phosphor 24 near the upper surface 12b of the base 12. Thus, the emission of light by the phosphor 24 is significantly great near the upper surface 12b of the base 12 compared to the emission of light near the upper surfaces 14c of the light-emitting elements 14.

Moreover, among the light that is emitted downward from the PN junction 14d, the light that passes through the side surface 14e of each light-emitting element 14 advances in a lateral direction. Thus, the distance by which the light travels through the phosphor deposition layer 25 is increased. In this respect also, the color of light is inclined toward the color of light emitted by the phosphor 24, and uneven light emission occurs between a case in which the light-emitting device 31 is seen from the front and a case in which the light-emitting device 31 is seen from the side.

FIG. 16 shows a light-emitting device according to a second embodiment of the present invention. In the above-mentioned embodiment, the case in which the plurality of dummy elements 15, which have the same shape as the plurality of light-emitting elements 14, are arranged around each light-emitting element 14 is described. However, as illustrated in FIG. 16, a transparent resin material 26 may be applied to the surrounding parts of the plurality of light-emitting elements 14. The transparent resin material 26 has flowability. The transparent resin material 26 is applied up to the height corresponding to the upper surfaces of the light-emitting elements 14 and cured. Thus, the mounting area 12a is filled with the transparent resin material 26 without partitions. The transparent resin material 26 desirably includes no phosphor.

FIGS. 17 to 20 show a light-emitting device 41 according to a third embodiment of the present invention. Like the light-emitting device of the aforementioned embodiments, the light-emitting device 41 includes a rectangular base 42 and a substrate 43. The substrate 43 is placed on the upper surface of the base 42 and has the same shape as the base 42. The substrate 42 has an opening 43a at the central portion of the substrate 42. The plurality of light-emitting elements 14 and the plurality of dummy elements 15 are arranged on a mounting area 42a of the base 42. The mounting area 42a is exposed from the opening 43a. In this embodiment, the opening 43a and the mounting area 42a are formed into a circular shape. The plurality of light-emitting elements 14 are arranged on the mounting area 42a to correspond to the outer shape of the mounting area 42a.

More specifically, six light-emitting elements 14 are arranged in a lateral direction near the center of the circle of the mounting area 42a. As the distance from the center increases upward and downward, the number of the light-emitting elements 14 decreases to four light-emitting elements 14, which are arranged in the lateral direction, and further to two light-emitting elements 14, which are arranged in the lateral direction. The light-emitting elements 14 are all arranged at predetermined intervals from one another, and the dummy elements 15, which are the fillers, are arranged between the light-emitting elements 14.

Similarly to the first embodiment, the dummy elements 15 have the same shape as the light-emitting elements 14 and are arranged between the light-emitting elements 14, which are arranged at predetermined intervals with one another. Thus, the plurality of light-emitting elements 14 and the plurality of dummy elements 15 are arranged in a checkered pattern, and each of the light-emitting elements 14 is surrounded by four dummy elements 15 all around.

In this embodiment, the mounting area 42a is not entirely filled with the dummy elements 15, and a space 44 is formed between the dummy elements 15 that are arranged on the outer circumferential portion and the circular inner circumferential edge of the opening 43a. The space 44 is left as it is so that part of the upper surface 42b of the base 42 is exposed.

As illustrated in FIGS. 17 and 18, a pair of electrodes 45a, 45b with semicircular notches are provided on both sides of the opening 43a on the upper surface of the substrate 43. The electrodes 45a, 45b include a pair of semicircular electrode patterns 46a, 46b and a pair of triangular electrode pads 47a, 47b. The semicircular electrode patterns 46a, 46b extend along the circumference of the opening 43a. The triangular electrode pads 47a, 47b are formed near a pair of opposite corners of the substrate 43. The semicircular electrode patterns 46a, 46b and the triangular electrode pads 47a, 47b are formed by applying the resist film 18 on the upper surface of the substrate 43. A circular pad 47c indicates the polarity.

The plurality of light-emitting elements 14, which are arranged on the mounting area 42a, are electrically coupled to one another such that the laterally adjacent light-emitting elements 14 are electrically coupled to each other with one of the dummy elements 15 located in between. Two rows of the light-emitting elements 14 are arranged at the center portion of the mounting area 42a. The upper and lower rows of the light-emitting elements 14 each include six light-emitting elements 14 arranged in the lateral direction. The element electrodes 14a, 14b of the light-emitting elements 14 are electrically coupled to one another using the bonding wires 21. The light-emitting elements 14 on the left and right ends of each row are electrically coupled to the pair of semicircular electrode patterns 46a, 46b to form two rows of linear light-emitting portions arranged in parallel and in which six light-emitting elements 14 are coupled in series.

Another two rows of the light-emitting elements 14 are further provided above and below the linear light-emitting portions. One of the rows includes four light-emitting elements 14 and the other row includes two light-emitting elements 14. In this case also, the four light-emitting elements 14 and the two light-emitting elements 14 are coupled in series to form a linear light-emitting portion in which six light-emitting elements 14 are coupled in series. In this manner, this embodiment includes four rows of linear light-emitting portions arranged in parallel one above the other in the circular mounting area 42a. Each row of linear light-emitting portion includes six light-emitting elements 14 coupled in series.

As illustrated in FIGS. 19 and 20, the plurality of light-emitting elements 14 and the plurality of dummy elements 15, which are arranged on the mounting area 42a, are sealed by the sealing resin body 16. Similarly to the first embodiment, first, a light-transmitting sealing frame 48 is provided around the opening 43a in the substrate 43. In this embodiment, when the sealing frame 48 is provided, the space 44 formed in the periphery of the mounting area 42 is also filled with a resin material 48a. The resin material 48a is the same as the material of the sealing frame 48. As illustrated in FIG. 20, the entire mounting area 42a is leveled by applying the resin material 48a up to the same height as the upper surfaces of the dummy elements 15.

Next, the sealing resin body 16 is applied in the mounting area 42a, which is surrounded by the sealing frame 48. Similarly to the first embodiment, the sealing resin body 16 is the light-transmitting resin binder 23 with the predetermined amount of particulate phosphor 24 (see FIG. 14).

Since the phosphor 24 has a greater specific gravity than the resin binder 23, the phosphor 24 is deposited uniformly near the upper surfaces 14c of the plurality of light-emitting elements 14 and the upper surfaces 15a of the dummy elements 15 while the resin binder 23 cures to form the phosphor deposition layer 25. The phosphor deposition layer 25 is also formed on the upper surface of the resin material 48a, which fills the space 44 on the periphery of the mounting area 42a.

Thus, when the sealing resin body 16 is viewed from the top as illustrated in FIG. 19, no border between colors is formed in the sealing resin body 16 between sections corresponding to the light-emitting elements 14 and the dummy elements 15 and between sections corresponding to the dummy elements 15 and the inner circumferential edge of the opening 43a, and the entire mounting area 42a has a uniform luminescent color. Since the phosphor deposition layer 25 is formed at the same height, no uneven light emission occurs.

FIG. 21 shows a light-emitting device 51 according to a fourth embodiment of the present invention. Like the third embodiment, the light-emitting device 51 includes six rows of the light-emitting elements 14, which are arranged one above the other in the circular mounting area 42a. Two of the six rows of the light-emitting elements 14 are provided near the center of the mounting area 42a and each include six light-emitting elements 14, which are arranged in the lateral direction. Another two of the six rows of the light-emitting elements 14 are provided above and below the above-mentioned central rows of the light-emitting elements 14 and each include four light-emitting elements 14, which are arranged in the lateral direction. The last two of the six rows of the light-emitting elements 14 are provided above and below the four rows of light-emitting elements 14 described above and each include two light-emitting elements 14, which are arranged in the lateral direction. All the light-emitting elements 14 are arranged at predetermined intervals, and the dummy elements 15, which have the same shape as the light-emitting elements 14, are arranged between the light-emitting elements 14.

The element electrodes 14a, 14b of the light-emitting elements 14 are electrically coupled to one another using the bonding wires 21. The light-emitting elements 14 on the left and right ends of each row are electrically coupled to the pair of semicircular electrode patterns 46a, 46b (see FIG. 17) to form four rows of linear light-emitting portions each including six light-emitting elements 14 coupled in series. In this embodiment, the rows of the light-emitting elements 14 are shifted in the lateral direction relative to one another by a distance corresponding to one light-emitting element 14. As a result, the light-emitting elements 14 are prevented from being unbalanced in the mounting area 42a and are spread to the entire mounting area 42a. This configuration allows the entire mounting area 42a to emit light more uniformly.

Since the components of the light-emitting device 51 of this embodiment are approximately the same as the components of the light-emitting device 41 of the third embodiment except the positional displacement of the light-emitting elements 14 described above, the same reference numerals are given and detailed explanations are omitted.

FIGS. 22 to 25 show a light-emitting device 61 according to a fifth embodiment of the present invention. The light-emitting device 61 includes a planar base 62 and a substrate 63. The planar base 62 is formed by making notches in a pair of opposite corners of a rectangle such that the cut-out pieces have a quarter round shape. The substrate 63 is placed on the upper surface of the base 62 and has the same shape as the base 62. The substrate 63 has a rectangular opening 63a at the central portion, and a mounting area 62a of the base 62 is exposed from the opening 63a. Unlike the above-described embodiments, however, only one light-emitting element 14 is arranged at the central portion of the mounting area 62a of the light-emitting device 61.

The light-emitting element 14 is surrounded by eight dummy elements 15, which have the same shape as the light-emitting element 14. Four of the dummy elements 15 are arranged to contact the side surfaces of the light-emitting element 14. In this embodiment, the light-emitting element 14 and the eight dummy elements 15, which surround the light-emitting element 14, fill the entire mounting area 62a. However, spaces may be provided along the inner circumferential edge of the opening like the third embodiment.

The light-emitting element 14 is electrically coupled to a pair of L-shaped electrode patterns 66a, 66b. The L-shaped electrode patterns 66a, 66b are formed along the circumference of the opening 63a in an L shape. Similarly to the first embodiment, the light-emitting element 14 and the dummy elements 15 are then sealed by the sealing resin body 16, which contains the phosphor. Similarly to the first embodiment, first, a light-transmitting sealing frame 65 is provided around the opening 63a, which is formed in the substrate 63. Next, the mounting area 62a, which is surrounded by the sealing frame 65, is filled with the sealing resin body 16. Similarly to the first embodiment, the sealing resin body 16 is a light-transmitting resin binder containing a predetermined amount of particulate phosphor. Since the phosphor has a greater specific gravity than that of the resin binder, the phosphor is deposited uniformly near the upper surface 14c of the light-emitting element 14 and near the upper surfaces 15a of the dummy elements 15 while the resin binder cures to form the phosphor deposition layer 25.

Thus, as illustrated in FIG. 24, no border between colors is formed in the sealing resin body 16 between a section of the sealing resin body 16 corresponding to the light-emitting element 14 and a section of the sealing resin body 16 corresponding to the dummy elements 15, which surround the light-emitting element 14, when the sealing resin body 16 is viewed from the top, and the entire mounting area 62a has a uniform luminescent color. Since the phosphor deposition layer 25 is formed at positions in the same height, no uneven light emission occurs.

Similarly to the first embodiment, the L-shaped electrode patterns 66a, 66b are formed together with a pair of triangular electrode pads 67a, 67b by applying the resist film 18 on a pair of L-shaped electrodes 64a, 64b. The pair of L-shaped electrodes 64a, 64b are formed along the rim of the opening 63a.

FIG. 26 shows a light-emitting device 71 according to a sixth embodiment of the present invention. The light-emitting device 71 has the same configuration as the light-emitting device 61 of the fifth embodiment except that the planar shape of dummy elements 15' differs. The shape of the dummy elements 15' of this embodiment is the same as the planar shape when two light-emitting elements 14 are placed side by side. That is, each dummy element 15' has a size twice the size of the dummy elements 15 of the above embodiments. As illustrated in FIG. 26, the entire mounting area 62a is filled by arranging only four dummy elements 15' around the single light-emitting element 14, which is arranged at the central portion of the mounting area 62a. Since the components of the light-emitting device 71 other than the dummy elements 15' are approximately the same as the light-emitting device 61 of the fifth embodiment, the same reference numerals are given and detailed descriptions are omitted.

In the light-emitting diode optical source device disclosed in Japanese Unexamined Patent Application Publication No. 2011-009298, the mounting area, on which the plurality of LED elements are mounted, is sealed by light-transmitting resin. In some cases, the light-transmitting resin contains a phosphor to increase color quality. Since the phosphor has a greater specific gravity than the light-transmitting resin, when the light-transmitting resin is applied to the mounting area and cured, particles of the phosphor are deposited on the upper surfaces of the LED elements and the surface of the base between the LED elements. However, if the height of the deposited phosphor varies, the entire mounting area might have uneven color and uneven luminance, failing to emit light with uniform brightness.

In the light-emitting diode disclosed in Japanese Unexamined Patent Application Publication No. 2002-208740, the first coating portion, which includes a part of the phosphor that is disposed on the LED element, has approximately the same thickness as the second coating portion, which includes a part of the phosphor that is disposed on the support and that is not disposed on the LED element. However, since the height of the upper surface of the LED element differs from the height of the upper surface of the support around the LED element, the color of light and luminance differ between a section of the light-emitting diode corresponding to the LED element and a section of the light-emitting diode corresponding to the support around the LED element. Thus, the light-emitting diode of this publication fails to provide uniform light emission as a whole.

In view of the above issues, the embodiments of the present invention provides a light-emitting device that eliminates or minimizes uneven light emission and uneven luminance in a mounting area on which a light-emitting element is arranged and that emits light with uniform brightness from the entire mounting area.

In a possible embodiment, an upper surface of the at least one light-emitting element may be flush with an upper surface of the filler.

In another possible embodiment, the filler may include a dummy element having the same shape as the at least one light-emitting element. In another possible embodiment, the dummy element may include at least one material among sapphire and silicone. The sapphire and silicone may include a light-transmitting property.

In another possible embodiment, the filler may include a light-transmitting property and a thermal conductivity that is greater than the thermal conductivity of the at least one light-emitting element and the sealing resin body.

In another possible embodiment, the base may include a metal material, and the substrate may include an insulative material.

Obviously, numerous modifications and error of the present invention are possible in light of the above teachings. It is therefore to be understood that within the scope of the appended claims, the present invention may be practiced otherwise than as specifically described herein.

What is claimed as new and desired to be secured by Letters Patent of the United States is:

1. A light-emitting device comprising:
    a base comprising:
        an upper surface; and
        a mounting area;
    a substrate disposed on the upper surface of the base, the substrate comprising an opening, the mounting area being exposed from the opening of the substrate;
    at least one light-emitting element disposed on the mounting area of the base;
    a filler disposed around the light-emitting element; and
    a sealing resin body comprising a phosphor, the sealing resin body being configured to seal the light-emitting element and the filler,
    wherein the filler comprises a dummy element having a same shape as the at least one light-emitting element, the dummy element comprising at least one material among sapphire and silicone, the sapphire and the silicone comprising a light-transmitting property.

2. The light-emitting device according to claim 1, wherein the mounting area comprises at least one of a rectangle and a circle as viewed from the top.

3. The light-emitting device according to claim 1, wherein the at least one light-emitting element is disposed at a central portion of the mounting area.

4. The light-emitting device according to claim 1, wherein the at least one light-emitting element and the filler, which is disposed around the light-emitting element, are in contact with each other.

5. The light-emitting device according to claim 1, wherein an upper surface of the at least one light-emitting element is flush with an upper surface of the filler.

6. The light-emitting device according to claim 1, wherein the filler comprises a light-transmitting property and a thermal conductivity that is greater than a thermal conductivity of the at least one light-emitting element and the sealing resin body.

7. The light-emitting device according to claim 1, wherein the filler fills an entirety of the mounting area except for an area of the at least one light-emitting element, which is disposed on the mounting area.

8. The light-emitting device according to claim 1, wherein the sealing resin body comprises a phosphor deposition layer on an upper surface of the at least one light-emitting element and an upper surface of the filler.

9. The light-emitting device according to claim 1, wherein the base comprises a metal material, and the substrate comprises an insulative material.

10. A light-emitting device comprising:
    a base comprising:
        an upper surface; and
        a mounting area;
    a substrate disposed on the upper surface of the base, the substrate comprising an opening, the mounting area being exposed from the opening of the substrate;
    a plurality of light-emitting elements disposed on the mounting area of the base at predetermined intervals with one another;
    a filler disposed around each of the plurality of light-emitting elements; and
    a sealing resin body comprising a phosphor, the sealing resin body being configured to seal the plurality of light-emitting elements and the filler,
    wherein the filler comprises a plurality of dummy elements having a same shape as each of the plurality of light-emitting elements, the dummy elements comprising at least one material among sapphire and silicone, the sapphire and the silicone comprising a light-transmitting property.

11. The light-emitting device according to claim 10, wherein the mounting area comprises at least one of a rectangle and a circle as viewed from the top.

12. The light-emitting device according to claim 10, wherein the plurality of light-emitting elements are disposed to correspond to an outer shape of the mounting area.

13. The light-emitting device according to claim 10, wherein the plurality of light-emitting elements and the filler, which is disposed around the light-emitting elements, are in contact with each other.

14. The light-emitting device according to claim 10, wherein upper surfaces of the plurality of light-emitting elements are flush with an upper surface of the filler.

15. The light-emitting device according to claim 10, wherein the filler comprises a light-transmitting property and a thermal conductivity that is greater than a thermal conductivity of the plurality of light-emitting elements and the sealing resin body.

16. The light-emitting device according to claim 10, wherein the filler fills an entirety of the mounting area except for areas of the plurality of light-emitting elements, which are disposed on the mounting area.

17. The light-emitting device according to claim 10, wherein, in the mounting area, a part of the upper surface of the base is exposed between the filler, which is disposed around the plurality of light-emitting elements, and an inner circumferential edge of the opening of the substrate.

18. The light-emitting device according to claim 10, wherein the sealing resin body comprises a phosphor deposition layer on upper surfaces of the plurality of light-emitting elements and an upper surface of the filler.

19. The light-emitting device according to claim 10, wherein adjacent light-emitting elements of the plurality of light-emitting elements are electrically coupled to each other with the filler arranged in between.

20. The light-emitting device according to claim 10, wherein the base comprises a metal material, and the substrate comprises an insulative material.

* * * * *